United States Patent [19]
Marple et al.

[11] Patent Number: 5,777,887
[45] Date of Patent: Jul. 7, 1998

[54] FPGA REDUNDANCY

[75] Inventors: David P. Marple, Palo Alto; Laurence H. Cooke, San Jose, both of Calif.

[73] Assignee: Crosspoint Solutions, Inc., Santa Clara, Calif.

[21] Appl. No.: 439,675

[22] Filed: May 12, 1995

[51] Int. Cl.$^6$ ............... H03K 19/177; H04B 17/00
[52] U.S. Cl. ............ 364/489; 364/181; 364/183.01; 364/490; 364/491; 371/22.2
[58] Field of Search .............. 364/489; 371/22.2; 395/180, 181, 182.03, 182.04, 183.01

[56] References Cited

U.S. PATENT DOCUMENTS

| | | | |
|---|---|---|---|
| 4,920,497 | 4/1990 | Upadhyaya et al. | 364/491 |
| 5,239,487 | 8/1993 | Horejsi | 364/552 |
| 5,315,535 | 5/1994 | Kikuchi et al. | 364/490 |
| 5,430,734 | 7/1995 | Gilson | 371/22.2 |
| 5,498,979 | 3/1996 | Parlour et al. | 326/38 |

FOREIGN PATENT DOCUMENTS

WO 94/06211  3/1994  WIPO ............ H03K 19/173

OTHER PUBLICATIONS

Kuo, Sy-Yen, "Spare Allocation and Reconfiguration in Large Area VLSI" 1988 IEEE pp. 609–612.

Upadhyaya, Shombhu,"On the Repair of Defective Field Programmable Logic Arrays to Increase Yield" 1987 IEEE pp. 234–237.

Moore, Will, "A Review of Fault–Tolerant Techniques for the Enhancement of Integrated Circuit Yield" 1986 IEEE pp. 684–698.

*Primary Examiner*—Kevin J. Teska
*Assistant Examiner*—A. S. Roberts
*Attorney, Agent, or Firm*—Townsend and Townsend and Crew LLP

[57] ABSTRACT

An FPGA includes primary resources and redundant resources. To program an FPGA to perform a desired function, a pattern of programmable elements to be programmed that takes advantage of primary resources only is first prepared. This pattern is then modified responsive to previously obtained information about defects within the FPGA. The modified pattern takes advantage of redundant resources as direct or indirect substitutes for FPGA elements rendered unusable by defects. The FPGA is programmed in accordance with the modified pattern.

4 Claims, 11 Drawing Sheets

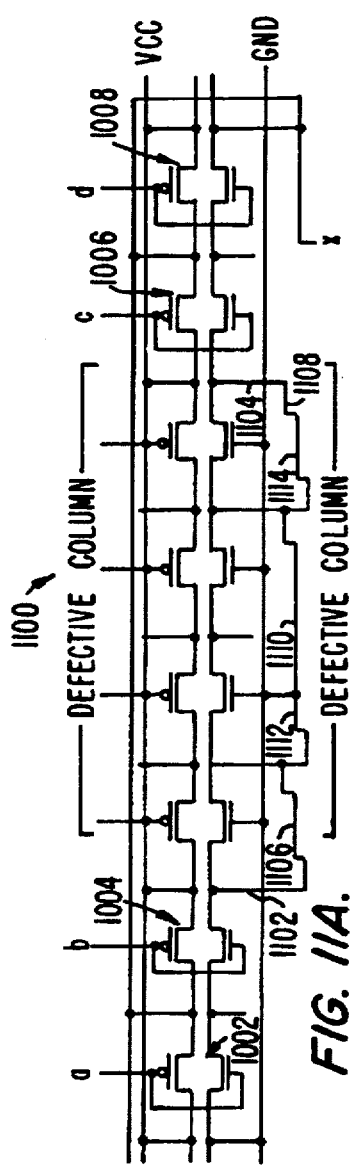

FPGA REDUNDANCY

BACKGROUND OF THE INVENTION

The invention relates to the architecture and programming of field programmable gate arrays (FPGAS) and in particular to techniques for making use of FPGAs with one or more defective programmable elements.

A typical FPGA may include transistors, logic blocks, and input and output circuits. The connections between the transistors, logic blocks, and input and output circuits are not fixed during fabrication but afterwards so as to permit easy customization of mass-produced parts. The transistors, logic blocks, and input and output circuits are connected to line segments which intersect or abut each other at various points. At most of these points programmable elements are located to make a connection between the line segments if desired. The FPGA is programmed to perform a desired function by programming a selected pattern of programmable elements.

In current practice, the programmable elements are stress tested after production. During the course of the stress test, defective programmable elements become programmed. The prior art practice is then to discard an FPGA even if only one programmable element is programmed in the stress test since there is no way of knowing in advance which programmable element so programmed will interfere with operation after the FPGA has been configured to perform a desired operation.

The prior art quality assurance process becomes problematic when applied to modern FPGAs with fine grain architectures and very large numbers of programmable elements. For example, the 12k FPGA of the CP20K architecture manufactured by the assignee of the present application has nearly 2 million programmable elements. Manufacture of zero defect FPGAs of this type is extremely difficult and large numbers of FPGAs must be discarded, raising cost.

SUMMARY OF THE INVENTION

In accordance with the invention, an FPGA includes primary resources and redundant resources. To program an FPGA of the invention to perform a desired function, a pattern of programmable elements to be programmed that takes advantage of primary resources only is first prepared. This pattern is then modified responsive to previously obtained information about defects within the FPGA. The modified pattern takes advantage of redundant resources as direct or indirect substitutes for FPGA elements rendered unusable by defects. The FPGA is programmed in accordance with the modified pattern.

In accordance with a first aspect of the invention, the primary resources and redundant resources are specially arranged so that the original desired interconnection pattern is preserved except within the immediate proximity of a defect relevant to the desired function. The redundant resources are distributed throughout the FPGA so that they are available within the near vicinity of the relevant defect. This feature provides important advantages in that important physical characteristics of the original layout, i.e. line lengths, capacitances etc., are preserved to the greatest possible extent.

In accordance with a second aspect of the invention, a row-based FPGA architecture with horizontal rows of logic elements and routing channels between the rows is adapted to include redundant horizontal line segments in the routing channel. If a defect within the routing channel renders a needed horizontal line segment unusable, a redundant segment substitutes.

In accordance with a third aspect of the invention, certain columns of an FPGA array are designated to be redundant. A connection pattern is generated to perform a desired function without the use of elements within the redundant columns. If a defect within a column renders a needed vertical line segment unusable, the connection pattern is modified so that columns shift from the affected column toward a redundant column so that the affected column is no longer used. In accordance with the invention, certain line segments include special extensions to facilitate connections across the affected column while minimizing disruption of the original connection pattern.

In accordance with a fourth aspect of the invention, information about defects is stored in a static register on an FPGA. Thus, if FPGAs are to be programmed in large quantities to perform a desired function, a connection pattern can be predetermined and then modified for each FPGA in accordance with the stored defect information.

Since many FPGAs have only a few defects, the redundancy techniques of the invention allow the use of FPGAs which would previously have been discarded, increasing yield and lowering cost. In mass programming applications, the complete connection pattern need only be generated once and efficiently modified to accommodate defects on individual FPGAs. Furthermore, since redundant resources may be distributed throughout the array, connections need not be stretched far to incorporate redundant elements, thus preserving, to the extent possible, timing characteristics of the original connection pattern.

In accordance with a fifth aspect of the invention defective FPGAs that are not universally programmable are used by comparing information about their specific defects to the programming needs of particular applications. An FPGA with too many defects for general application may nonetheless be usable for specific applications. This technique further increases effective yield.

The invention will be better understood by reference to the following detailed description in connection with the accompanying drawings.

BRIEF DESCRIPTION OF THE DRAWINGS

FIGS. 11A–11B depict how interconnections are modified in accordance with the invention when a logic cell is split by a defective column;

DESCRIPTION OF SPECIFIC EMBODIMENTS

FPGA Structure and Operation

To facilitate an understanding of the present invention, the general organization of a particular FPGA architecture will be described first. Complete details of this representative architecture are disclosed in U.S. Pat. No. 5,313,119 issued to Cooke et al., U.S. Pat. No. 5,347,519 issued to Cooke et al., and U.S. Pat. No. 5,221,865 issued to Phillips et al., all three assigned to the assignee of the present application. The contents of these patents are incorporated herein by reference. It will be understood however that the present invention is not limited to the particular FPGA described.

Figure 1:
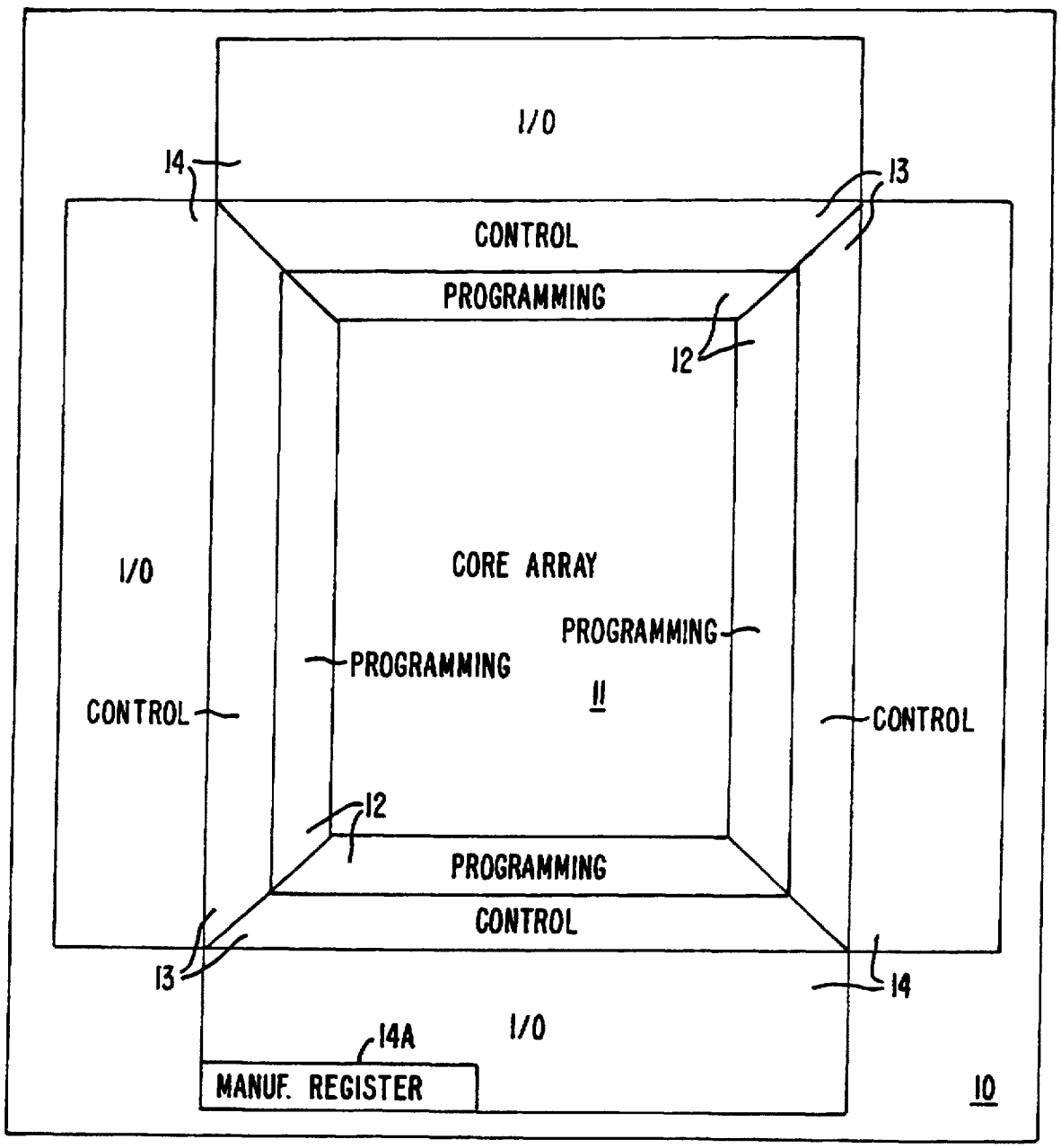
FIG. 1 shows the general organizational layout of a representative FPGA.

A top view of a field programmable gate array (FPGA) integrated circuit implementing the present invention is illustrated in FIG. 1. The drawing shows the general organizational layout of the FPGA.

On a semiconductor substrate 10 the FPGA has a central core array section 11, which contains the continuous-series transistors (CST), latch/logic blocks (LLB) and antifuses which are programmed to configure the transistors and blocks for the user's application.

Surrounding the core array section 11 is a section 12, here shown as four separate areas, which contain the circuits for programming the antifuses in the core array 11. Included in this section 12 is circuitry for controlling the special programming voltages, $V_{pp}$ and $V_{ss}$, for programming the antifuses. Other programming circuitry is distributed throughout the core array section 11. On the outside of this programming section 12 is a control section 13, again shown as four separate areas, which contains the control circuitry used for addressing the wiring segments in programming the selected antifuses.

Finally, an input/output section 14 is located on the periphery of the substrate 10. The section 14 contains the input and output circuitry for receiving signals from the outside world into the FPGA interior and for driving signals from the interior of the FPGA to the outside world. In accordance with the present invention, the input/output section 14 also includes a special manufacturing register 14A, the purpose of which is explained below. Further details of input/output section 14 are disclosed in U.S. Pat. No. 5,347,519.

Figure 2:
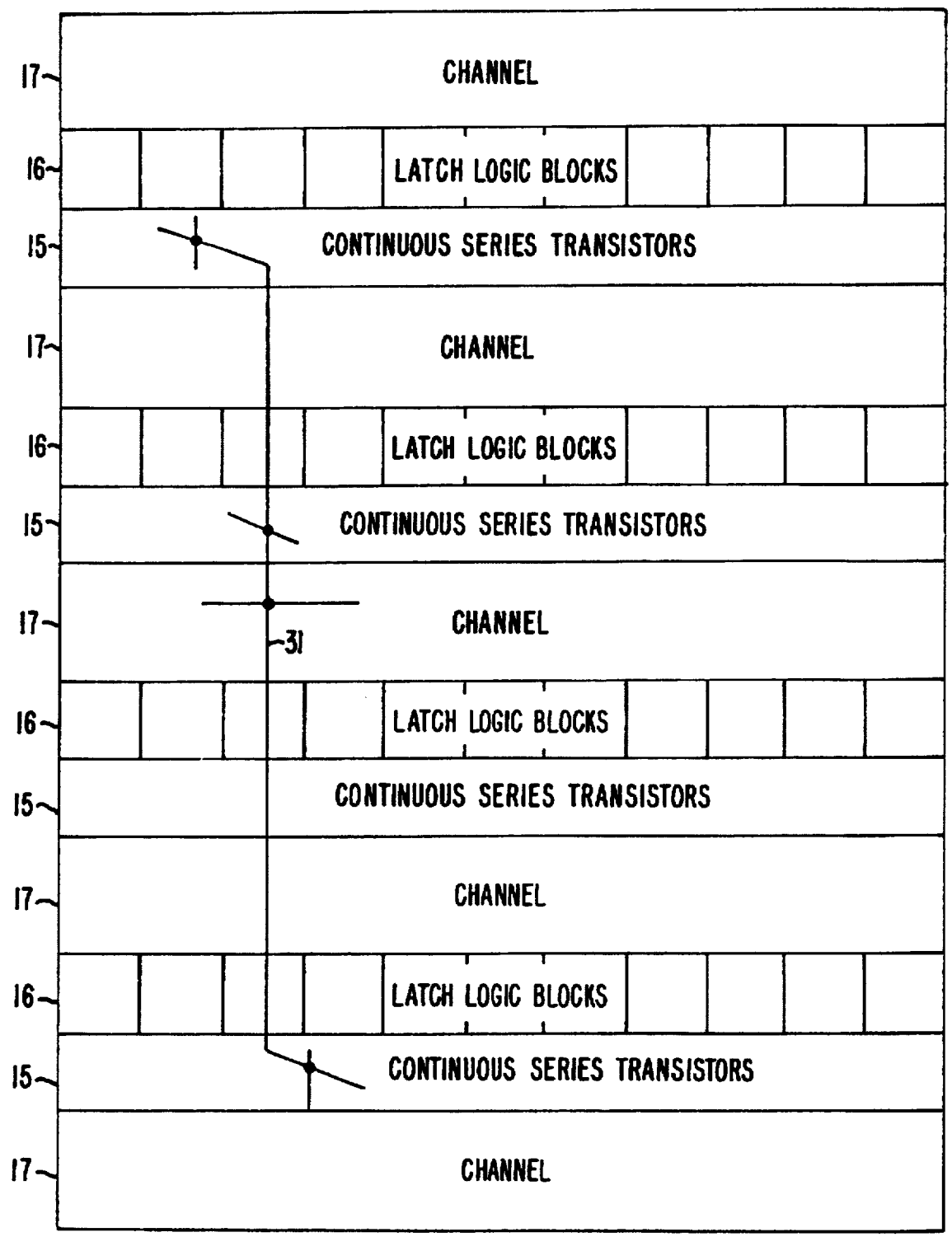
FIG. 2 shows a representational view of the FPGA core array.

FIG. 2 shows a representational view of the FPGA core array 11. The array 11 has horizontal CST (continuous series transistor) rows 15 and LLB (latch logic block) rows 16 which are interleaved with horizontal routing channels 17 between the CST and LLB rows 15 and 16. The CST rows 15 are used to implement different logic cells, from standard drive to high drive inverters, from multiple input NAND and NOR gates, to more complex AOI (AND-or-invert) cells. These rows 15 can also implement multiplexer-based logic cells. However, the adjacent LLB rows 16, each of which contains a row of preconfigured logic blocks as indicated by the vertical lines in the rows 16, are more efficient for implementing such cells. In the rows 15 and 16 and channel 17 are horizontal and vertical wiring segments. At the intersection of many of the segments are antifuses, which, when programmed, electrically connect intersecting segments together. By appropriate selection of antifuses to program, the CST rows 15 and LLB rows 16 can be flexibly configured into the desired logic cells and the channels 17 can make the required intercell connections.

Thus cell functions and circuit connections are defined by programming the appropriate antifuse element which then forms a low resistance connection between intersecting horizontal and vertical wiring segments. The CST rows 15 and LLB rows 16 are logically and interconnectedly definable and can implement nearly any combinatorial logic or storage logic cell.

For purposes of explanation, some terms are now defined. In this application, the term "column" is used to indicate a vertical slice in the core array 11 having a width occupied by four opposing pairs of transistors in each CST row traversed by the column. Each opposing pair of transistors is a PMOS transistor and a NMOS transistor in a CST row 15. The term "tile" refers to a single pair of opposing transistors and associated wiring segments within a CST row 15.

Broadly speaking, the routing channels 17 are used to make the horizontal connections between the configured cells in the CST rows 15 and/or the LLB rows 16. The channels 17, which are interleaved with the CST rows 15 and LLB rows 16, contain horizontal segmented wiring tracks of different segment lengths. These horizontal wiring track segments vary from a minimum length of two columns to the entire width of the array 11.

Included within each channel 17 are also clock lines to be used as global clock signals, global enable or reset signals, or any other high fanout signal in the user's application. In the preferred embodiment, the clock lines found throughout the channels 17 constitute four independent clock grids for distributing clock signals within array 11. The clocks are driven from driver circuits along the sides of each channel 17 of the array 11.

Intersecting the horizontal segments in the channels 17 are vertical wiring segments to accommodate vertical connections between circuit nodes in the CST rows 15 and LLB rows 16. Antifuse elements, indicated by a small darkened circle at the intersection of two lines in the drawings of this patent application, are located at the intersections of the horizontal and vertical wire segments in the channel 17. Each channel 17 is a grid of horizontal and vertical wiring segments which have an antifuse at nearly every intersection.

Three types of vertical wiring are used in the core array 11. The first type is formed by a segment connected to a PMOS or NMOS transistor terminal or an LLB terminal. Both are described in more detail below with respect to FIG. 3. This type of vertical segment forms a route from a horizontal wire segment in an adjacent channel 17 to the cell in the CST row 16 or LLB row 15.

The second type of vertical wiring is a vertical chevron. As illustrated in FIG. 2, each of these vertical wiring segments 31 span four CST rows 15 and intervening LLB rows 16. The chevrons 31 start and end on the CST rows 15. The term "chevron" is used because these wiring segments have a diagonal wire portion (or half chevron) in the rows 15 in which the vertical chevrons 31 start and end. The diagonal wire portions horizontally span five tiles. The central vertical portion of each vertical chevron passes through three routing channels 17 and two rows 15. As symbolically indicated in FIG. 2, each vertical chevron 31 may be connected through antifuses along either diagonal end portion to vertical segments in the rows 15 or along the center portion of the segment 31 which passes through the channels 17 and rows 15 to horizontal segments in the channels 17 and rows 15. In passing, it should be noted that the horizontal segments in the rows 15 are actually diagonal.

Figure 3:
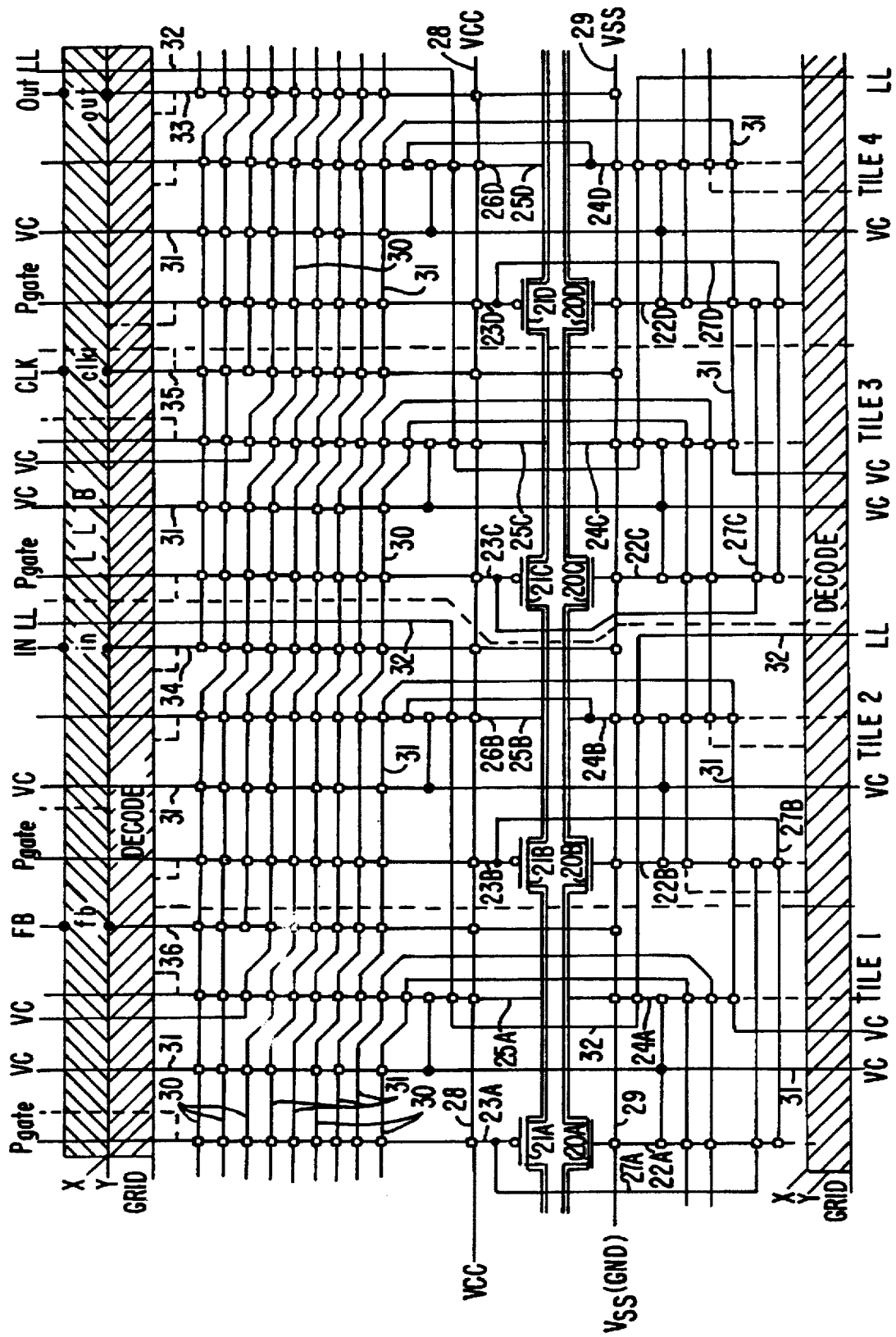
FIG. 3 illustrates the arrangement of a portion of a CST and LLB row and related wiring segments.

FIG. 3 described below with respect to the CST row 15 also shows how the vertical chevrons 31 are mapped on to the core array 11. The pattern is regular and repeats both horizontally and vertically. A full vertical chevron exists for every two tiles, or half a column, with a diagonal segment every tile. Two vertical chevrons feed through every two CST tiles and end on different rows.

The third type of vertical wiring segment is a long line. Long lines extend long distances from the top to the bottom of the core array to make long vertical connections primarily. Generally these wiring segments extend either the entire distance, ½ the distance, or ⅓ (⅔) the distance of the core array height. Long lines are horizontally spaced so that a long line passes through a CST row 15 every two tiles.

Small logic gates, such as NAND, NOR, AND, OR and inverters, are efficiently configured in the CST rows 15. Each of the transistors in the rows 15 have wiring segments connected to its source/drain s and gate electrode. Other wiring segments travel to different parts of the core array. All of these wiring segments intersect with each other and antifuses are placed between these intersecting segments. By programming selected antifuses, the transistors of the CST rows 15 may be configured into the desired block.

FIG. 3 illustrates the arrangement of a portion of a CST row 15 and related wiring segments. Each row 15 contains two strings of continuous-series transistors with one string formed from NMOS transistors and the other with PMOS transistors. In the drawings a PMOS transistor is denoted by a circle on the gate of the MOS transistor symbol. Furthermore, in FIG. 3 the merging of the source/drain of one CST transistor into the source/drain of another transistor is indicated by the double line connecting the source/drains of the transistors.

Four NMOS transistors 20A–20D and four PMOS transistors 21A–21D are shown. It should be understood that these transistors 20A–20D and 21A–21B are connected by their source/drains to other transistors in the row 15 which are not shown in the drawing.

Each of the gates of the NMOS transistors 20A–20D are connected to N gate wiring segments 22A–22D. Correspondingly, P gate wiring segments 23A–23D are respectively connected to each of the gates of the P transistors 21A–21D. These wiring segments 22A–22D and 23A–23D are run perpendicularly, or vertically, with respect to the alignment of the CST transistors 20A–20D and 21A–21D.

Wiring segments 24A–24D and 25A–25D are also connected to the respective source/drains (SD) of the NMOS and PMOS transistors 20A–20D and 21A–21D. For illustrative and labeling purposes, in FIG. 3 the source/drain to the right of each MOS transistor 20A–20D and 21A–21D is associated with the transistor. Thus each NMOS transistor 20A–20D has N SD wiring segments 24A–24D respectively connected to its source/drain of each NMOS transistor and each PMOS transistor 21A–21D has P SD wiring segments 25A–25D respectively connected to its source/drain. These SD wiring segments 24A–24D and 25A–25D also run vertically. All the P gate and P SD segments 22A–22D and 24A–24D can be connected to a $V_{cc}$ power supply wire 28 running along the length of each CST row 15. Likewise, all N gate and N SD segments 23A–23D and 25A–25D can be connected to a $V_{ss}$ power supply wire 29 running along the length of each CST row 15. As in most CMOS integrated circuits, $V_{cc}$ is at +5 volts and $V_{ss}$ is at ground, or 0 volts, but other voltages could be used.

All P gate segments 22A–22D and latch segments 33–36, which are connected to input and output terminals of the LLBs 40, discussed below, extend up into the channel 17 above and have connections to many wiring segments in the channel.

Running diagonally are an array of wiring segments 30 and 31. One half of these segments are vertical chevrons 31, mentioned previously, used for intercell routing. The other half are local chevrons 30 for intracell routing. The local chevrons 30 horizontally span nine columns of a CST row 15. There is one local chevron 30 horizontally for every two columns. The vertical chevrons 31 horizontally span five columns and there is one diagonal portion of a vertical chevron 31 for each tile. The local and vertical chevrons 30 and 31 intersect the P gate wiring segments 22A–22D, P SD segments 24A–24D, vertical sections of vertical chevrons 31 from CST rows above and below, and latch segments. The latch segments, along with the P gate segments, are wiring segments which run from a CST row 15 through a LLB row 16 to the channel 17 above. In FIG. 3 latch segments 33, 34, 35 and 36, labeled respectively (Data) OUT, (Data) IN, CLK (Clock) and FB (FeedBack), are shown. The vertical wiring long line 32, mentioned previously for distant intercell connections, is also shown. The chevrons 30 and 31 also bridge the PMOS transistors 20A–20D and NMOS transistors 21A–21D, and horizontally span two of the N SD segments 25A–25D.

The N gate segments 23A–23D and the P gate segments 22A–22D also have special gate crossover segments 27A–27D, which may connect not only directly opposing gate segments, but also gate segments to the immediate left or right. The gate segment crossover segments 27A–27D connected to directly opposing gate segments 22A–22D and 23A–23D are the primary means for connecting the N gate segments 23A–23D for the signal input line for nearly all configured logic cells. The crossover segments 27A–27D connected to the gate segments to the immediate right or left are typically used to implement multiplexer-based blocks in the row 15, although the LLBs may better implement such multiplexer-based cells.

Logic cells configured in a CST row 15 may be isolated from each other by connecting intervening transistors in the row by appropriate connections to the power supply lines at $V_{cc}$ and $V_{ss}$. For a PMOS transistor, the gate electrode is connected to $V_{cc}$. The PMOS transistor is effectively kept from being turned on; no current passes through the transistors. The PMOS transistors forming the logic cells on either side of the isolating transistor are electrically isolated from the other. Likewise, the gate electrode of a NMOS transistor in a CST row 15 is connected to $V_{ss}$ to keep the transistor from being turned on. The transistor becomes an effective isolation between NMOS transistors forming configured logic cells on either side.

The latch/logic blocks 40 of the rows 16 can implement multiplexer-intensive cells, such as latches, flip-flops, EXCLUSIVE-NOR (XNOR) logic gates, adders, and multiplexers, more efficiently than an interconnected circuit in the CST rows 15. On the other hand, these LLBs 40 can also be configured as simple logic gates, such as NAND or NOR logic circuits; however, they are inefficient compared to such logic cells in the CST rows 15. Additionally the LLB rows 16 can be assembled into moderately sized static RAM blocks without using any CST row 15. Further internal details of the LLB rows 16, I/O circuitry 14, control circuitry 13, and programming circuitry 12 are omitted here but are fully described in U.S. Pat. No. 5,313,119 and U.S. Pat. No. 5,347,519.

To make the desired connections and program the FPGA, the antifuses are used to configure the logic cells and to make cell-to-cell connections inside the FPGA. As described above, the transistors of the CST rows 15 and LLBs 40 in the LLB rows 16 are connected to wiring segments. These wiring segments intersect with antifuses between the wiring segments at the intersections. Thus selected antifuses are programmed to make the desired electrical connections to configure the wiring segments, CST transistors and LLBs into the desired cells and to make the intercell connections.

When the FPGA is manufactured, none of the antifuses of the core array 11 are programmed. The purchaser of the FPGA runs specialized software to generate a desired programming pattern of antifuses so that the FPGA will be interconnected to perform a desired function. This pattern serves as an input to other software running on programming equipment which actually programs the selected antifuses of the FPGA.

To connect two intersecting wiring segments, the two wiring segments must be simultaneously and independently addressed. One wiring segment is driven to a first programming voltage, $V_{pp}$, and the other wiring segment is driven to a second programming voltage, $V_{ss}$, while the remaining wires stay at an intermediate voltage. The difference between the two programming voltages across the antifuse at the intersection of the two segments programs the antifuse because it is greater than $V_{pf}$, the rupture voltage. U.S. Pat. No. 5,313,119 describes in detail how individual line segments are addressed and how the sequence of antifuses to be programmed is determined.

The antifuse itself is a programmable element which is placed between two conducting layers of the FPGA integrated circuit. A typical antifuse has a high resistance in the unprogrammed, or "off" state, and a low resistance in the programmed, or "on" state. Programming of the antifuse is performed by applying a large programming voltage, $V_{pp} - V_{ss} > V_{pf}$ across the antifuse for a period of time, typically fractions of a second. The large programming voltage breaks down the material across the antifuse and the following sustained heavy current changes the antifuse to a low resistance state.

Figure 4A:
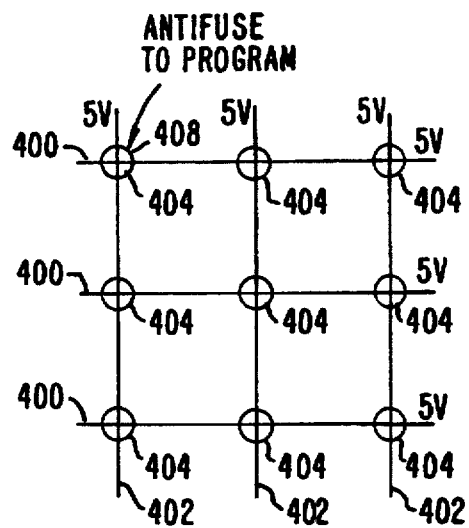
FIG. 4A illustrates a preparatory step prior to programming an individual antifuse of an FPGA.
Figure 4B:
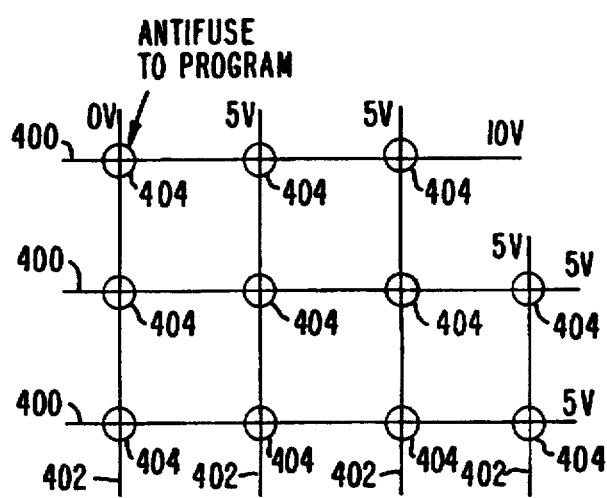
FIG. 4B illustrates a simplified representation of a section of an FPGA, useful for illustrating how an individual antifuse is programmed.

FIGS. 4A–4B depict a simplified representation of a section of an FPGA useful for illustrating how an individual antifuse is programmed. The FPGA includes horizontal wires 400, vertical wires 402, and antifuses 404. $V_{pp}$ is selected so that $V_{pp}/2 < V_{pf} < V_{pp}$ for a nominal $V_{pf}$. In this illustration, for a nominal $V_{pf}$, $V_{pp}$ is 10 V and $V_{ss}$ is 0 V.

A target antifuse 408 is to be programmed. First as shown in FIG. 4A, horizontal wires 400 and vertical wires 402 are precharged to a voltage $V_{pp}/2$, 5 V. Then, as shown in FIG. 4B, the horizontal wire connected to target antifuse 408 is raised to 10 V and the vertical wire connected to target antifuse 110 is lowered to 0 V. Target antifuse 410 experiences a voltage drop of $V_{pp}$ which is sufficient to program it while the voltage drop across the other antifuses is either $V_{pp}/2$ or 0. Upon antifuse breakdown, target antifuse 408 is soaked with high current and special current waveforms to stabilize the newly formed antifuse link and to lower the antifuse resistance.

For real devices, the $V_{pf}$ point varies depending on the thickness of antifuse material, roughness of metal terminals of the antifuse, and curvature of the antifuse corners. These factors are all difficult to carefully control in production wafer fabrication, resulting in a distribution of $V_{pf}$ over a large number of antifuses.

Figure 5:
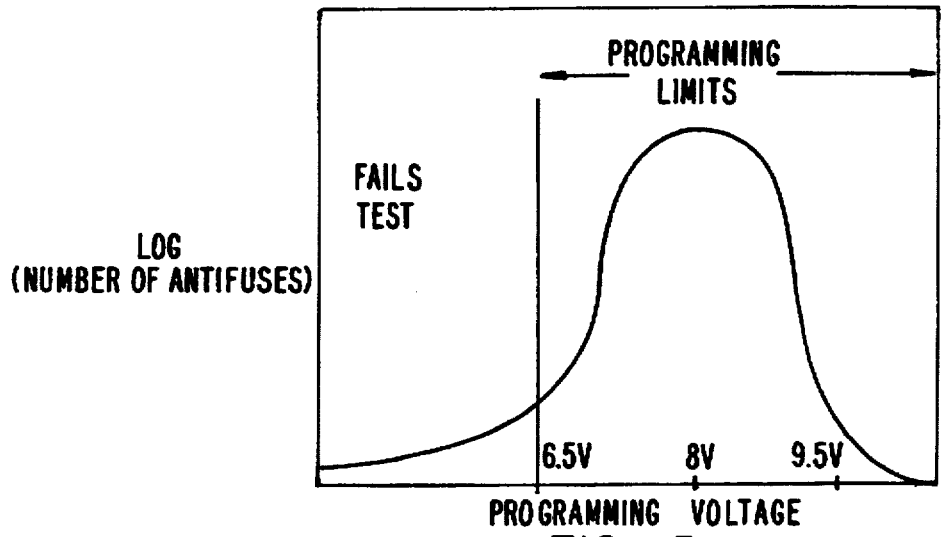
FIG. 5 depicts a distribution of actual $V_{pf}$ of antifuses having a target $V_{pf}$ of 8v and included within an FPGA with a $V_{pp}$ of 10 V.

FIG. 5 depicts a typical distribution for a target $V_{pf}$ of 8 v for antifuses used in an FPGA with a $V_{pp}$ of 10 V. The vertical axis is logarithmic. The low end $V_{pf}$ distribution is difficult to control in practice. Usually a small but significant fraction of antifuses rupture below 6.5 V for a target $V_{pf}$ of 8V, whereas very few antifuses would rupture above 9.5 V. Of course, other distributions are possible, some presenting the problem of antifuses that only rupture above 10 V.

Part of the quality assurance process for FPGAs is a stress test to assure that antifuses have a sufficiently high $V_{pf}$ that they will not accidentally program when exposed to $V_{pp}/2$ or 5 V for the distribution shown in FIG. 5. During this stress test all antifuses of an FPGA are exposed to a voltage somewhat higher than $V_{pp}/2$ causing defective antifuses to program. The prior art practice is then to discard an FPGA even if only one antifuse is programmed in the stress test since there is no way of knowing in advance which antifuse so programmed will interfere with operation after the FPGA has been configured to perform a desired operation.

Redundancy

In accordance with the invention, an FPGA architecture as is depicted in FIGS. 1–3 is modified to provide redundant regions so that the core array includes both primary and redundant resources. To program an FPGA of the invention to perform a desired function, a pattern of antifuses to be programmed using primary resources only is first prepared. This pattern is then compared to a list of identified defects on the FPGA. The defects may be defective antifuses identified during the stress test, shorts between wiring segments or other defects.

The pattern is modified so that segments affected by defects are no longer relied on for interconnection. The modification takes advantage of redundant resources including line segments, antifuses, and other FPGA elements as direct or indirect substitutes. The FPGA is then programmed in accordance with the modified pattern.

In one embodiment, the redundant resources found within the core array are selected columns of the array. This technique is herein referred to as column redundancy. In another embodiment, the redundant resources include groups of horizontal segments within routing channels and their associated antifuses. This technique is known as channel segment redundancy.

Column Redundancy

In accordance with the invention, defective columns are effectively replaced by redundant columns without affecting the logic routing in other columns.

If a defect interferes with desired functionality by corrupting resources within a given column, the column redundancy technique of the present invention identifies the column as defective. A redundant column then effectively substitutes for the defective column. Examples of such defects include defective antifuses connected to vertical segments, defective CST's, vertical segments shorted together, etc. Defective antifuses include antifuses that rupture during stress testing.

The substitution is accomplished by shifting columns in the original interconnection pattern. The shifting process is complex and follows special rules to assure that the desired functionality of the FPGA is preserved. In essence, however, the section of the original connection pattern that occupied the defective column, including vertical line segments, and CST and LLB resources shifts one column toward the right. Similarly, the pattern section occupying the column to the right of the defective column is also shifted one column to the right. This displacement continues until a redundant column is reached. Since the original connection pattern did not make use of the redundant column, the displacement halts there. The redundant column provides the additional array area lost through omission of the defective column.

Figure 6:
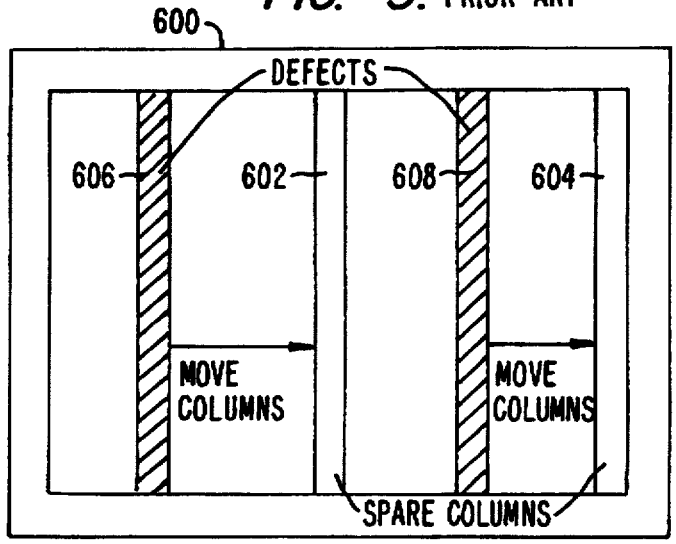
FIG. 6 shows an FPGA array with two columns noted as spare or redundant columns and two columns identified as defective in accordance with the invention.

FIG. 6 illustrates an array 600 wherein columns are shifted in accordance with the invention. Columns 602 and 604 are designated spare or redundant columns. Columns 606 and 608 include needed vertical segments affected by defective antifuses. The columns between defective column 606 and redundant column 602 are shifted toward redundant column 602. Similarly, the columns between defective column 608 and redundant column 604 are shifted toward redundant column 604.

The above is a highly simplified description of the shifting process. In actuality, the need to preserve connectivity while shifting columns requires special rules for certain routing resources and elements as well as modifications to the interconnection architecture. FIGS. 7–9 and 11 illustrate these rules and modifications in accordance with the preferred embodiment of the invention.

Figure 7:
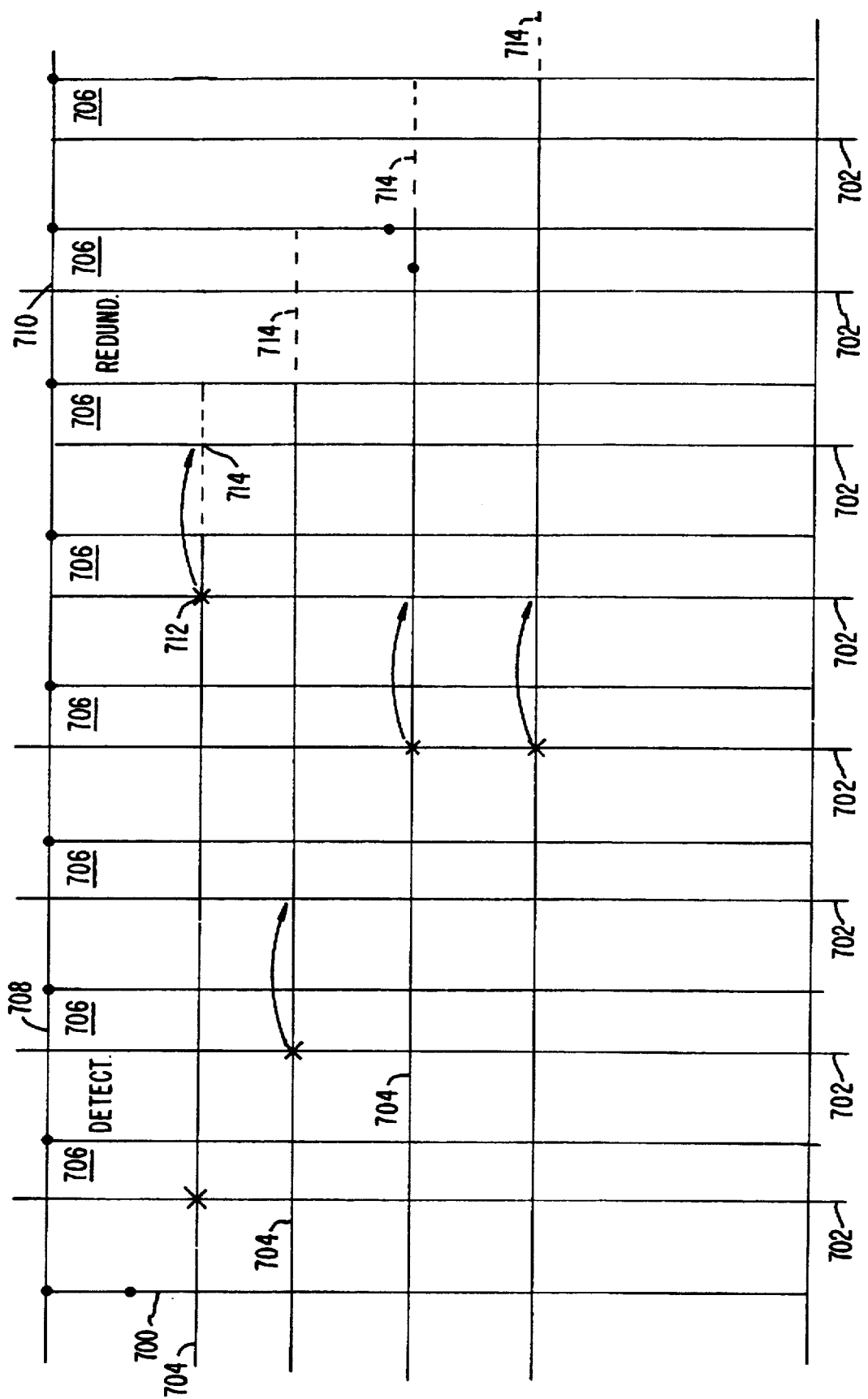
FIG. 7 illustrates how connections of a horizontal line segment are shifted to correct a defect in accordance with the invention.

FIG. 7 illustrates rules for shifting connections of a horizontal line segment toward a redundant column in accordance with the invention. FIG. 7 is a simplified representation of a portion of a routing channel 700 within an array depicting only representative vertical segments 702 and representative tracks 704. For further simplicity, only one vertical segment 702 is depicted in each column. The array is divided into columns 706 with a column 708 identified as defective and a column 710 identified as redundant. An original connection pattern is indicated by x's at points where vertical line segments and tracks are to be connected.

In the preferred embodiment, when connections to a horizontal segment must shift toward a redundant column, the connections shift along the same horizontal segment. Arrows leading from each so-marked connection point indicate how, in the preferred embodiment, the connections shift to correct the defective column 708.

As can be seen, the shifting of a connection 712 presents a problem in that the horizontal segment associated with connection 712 does not continue into the next column and no connection can be made to the depicted vertical segment in that column. This is not a problem for all of the connections to be moved because many horizontal line segments continue to the right into the next column, thus permitting a connection to move.

To solve this problem, in accordance with the invention, each horizontal line segment 704 incorporates a special extension 714 that extends to the right. The extensions 714 are not available for routing the original connection pattern. They are included to guarantee that connections on the horizontal segment may be shifted one column to the right for redundancy purposes.

Figure 8:
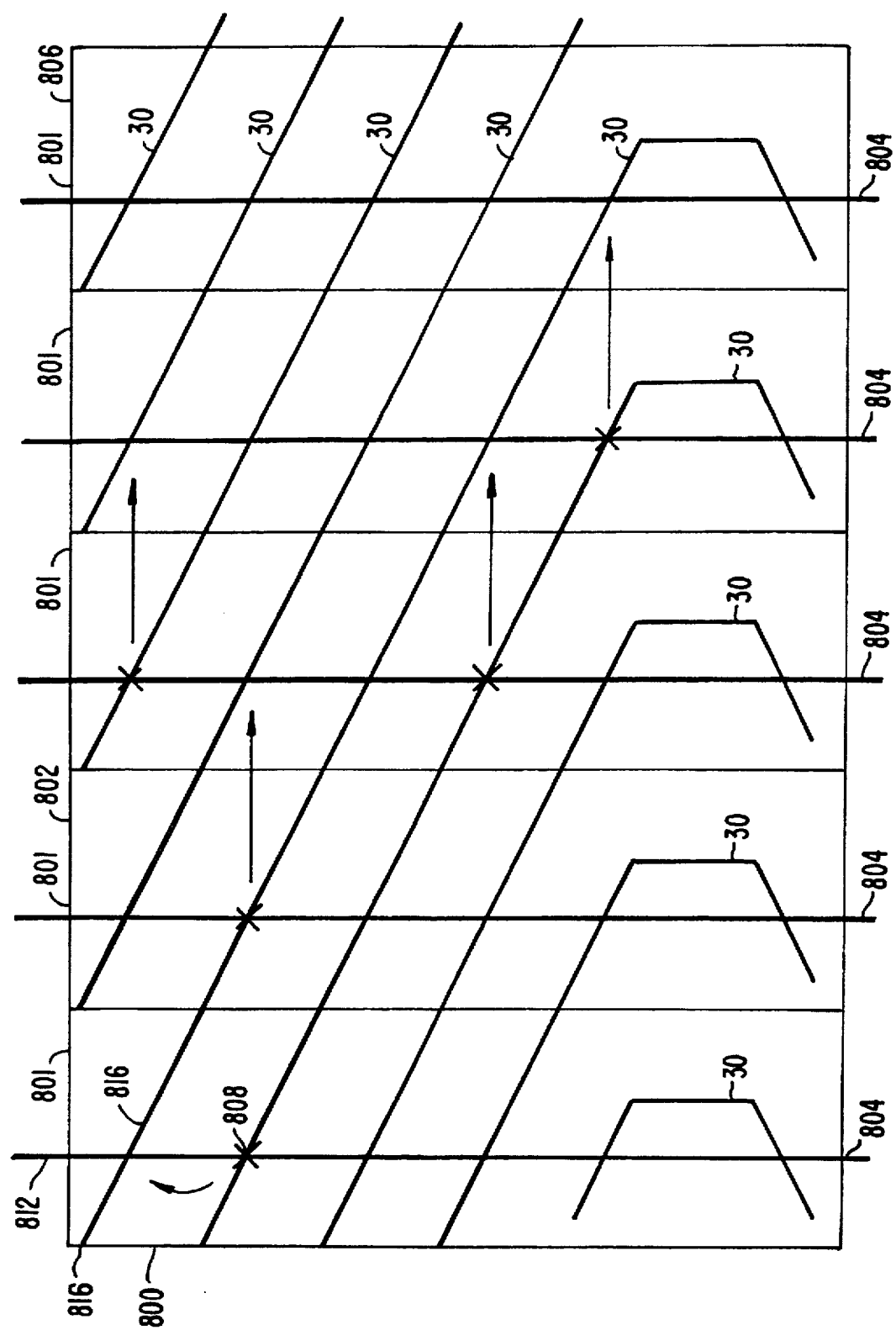
FIG. 8 illustrates how connections of a local chevron shift to correct a defect in accordance with the invention.

FIG. 8 illustrates rules for shifting connections along a local chevron to correct a defect in accordance with the invention. FIG. 8 is a simplified representation of a routing region 800 associated with a section of a CST row. Representative local chevrons are identified generically by reference designator 30. Selected vertical segments 804 are also shown.

The array is divided into columns generically identified as 801 including a defective column 802 and a redundant column 806. Again, an original connection pattern is indicated by x's at points where horizontal and vertical line segments are to be connected. Arrows leading from each so-marked connection point indicate how the connections shift to correct the defective column 802.

In accordance with a preferred embodiment of the invention, connections along a local chevron 30 and within and to the right of the defective column do not shift down and to the right along the same local chevron 30 but rather shift due right to a new destination local chevron. To maintain connectivity, local chevron connections to the left of the defective column must shift directly upwards to the new destination local chevron. Only those connections to local chevrons whose vertical segment is included or to the right of the defective column shift up to a new local chevron. The remaining local chevron connections to the left of the defective column remain unchanged.

A problem then presents itself for certain connections lying to the left of the defective column that should transfer to the destination local chevron but cannot because the destination local chevron does not reach far enough. Referring again to FIG. 8, a connection 808 connects a local chevron 810 and a vertical segment 812. Connection 808 does not shift to the right to correct the defective column since it lies to the left of the defective column. However, connection 808 should shift upwards to destination local chevron 814 to accommodate shifting of connections to the right of the defective column 802. But destination local chevron 814 does not reach far enough to the left to connect to vertical segment 810.

To solve this problem, in accordance with the invention, each local chevron 30 includes a special extension 816 reaching one column to the left. Like the extensions to the horizontal line segments, the extensions 816 are not used by the original connection pattern. Instead, they are included to guarantee that if connections to the left of a defective column must move to a new local chevron, the destination chevron will in fact reach to accommodate.

In an alternative embodiment, connections to a local chevron shift along the chevron itself rather than to a new local chevron. In this scheme, similar to the one used by the horizontal segments, extensions are required to the right in the event a connection in the rightmost column of the chevron must be used. The disadvantage of this approach is that since the local chevron has two parallel horizontal sections on the right coupled by a vertical section, the extension would be u-shaped instead of horizontal, requiring more area.

Figure 9A:
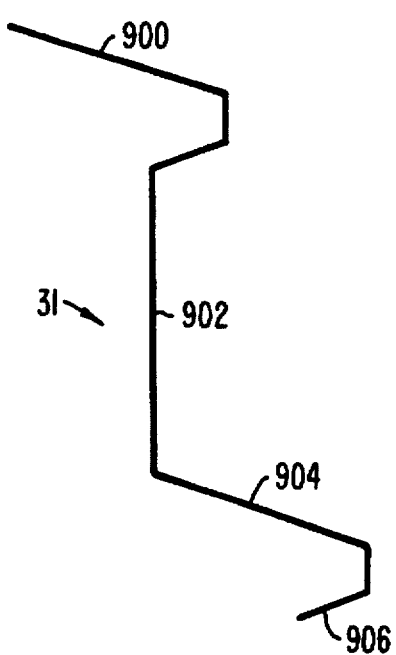
FIG. 9A depicts a simplified representation of a single vertical chevron in isolation.

The rules for shifting the connections of the vertical chevrons 31 are more complex and depend in part on where the vertical chevron is positioned in relationship to a defective column. FIG. 9A depicts a simplified representation of a single vertical chevron 31 in isolation. The vertical chevron 31 includes a top horizontal section 900, a vertical section 902, a bottom horizontal section 904, and a return horizontal section 906. As was previously described, the top and bottom horizontal sections 900 and 904 span five columns. The vertical section passes through three routing channels 17 and two rows 15.

Figure 9B:
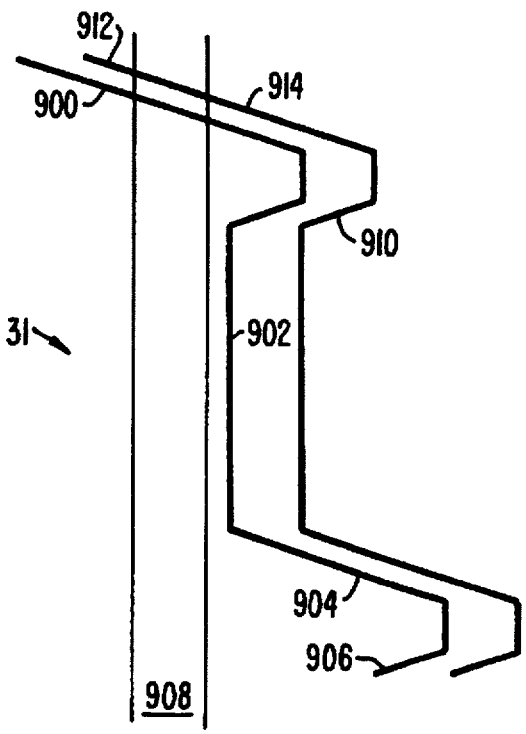
FIG. 9B illustrates a situation where a defective column is to the left of the vertical section of a vertical chevron.

FIG. 9B illustrates a situation where a defective column 908 is to the left of vertical section 902. Connections must move to a different vertical chevron 910 to the right. Generally, connections cannot move along the same vertical chevron in this situation because connections on vertical section 902 would have no destination. The same would be true if the defective column 908 encompassed vertical chevron 902. Even if a vertical section 902 is unconnected for a particular design, it may still be needed as a destination for connections of another vertical chevron to the left. As with the local chevrons, an extension 912 to the left is required to insure that a top horizontal section 914 of the destination vertical chevron 910 can reach needed connections to the left of defective column 908.

Figure 9C:
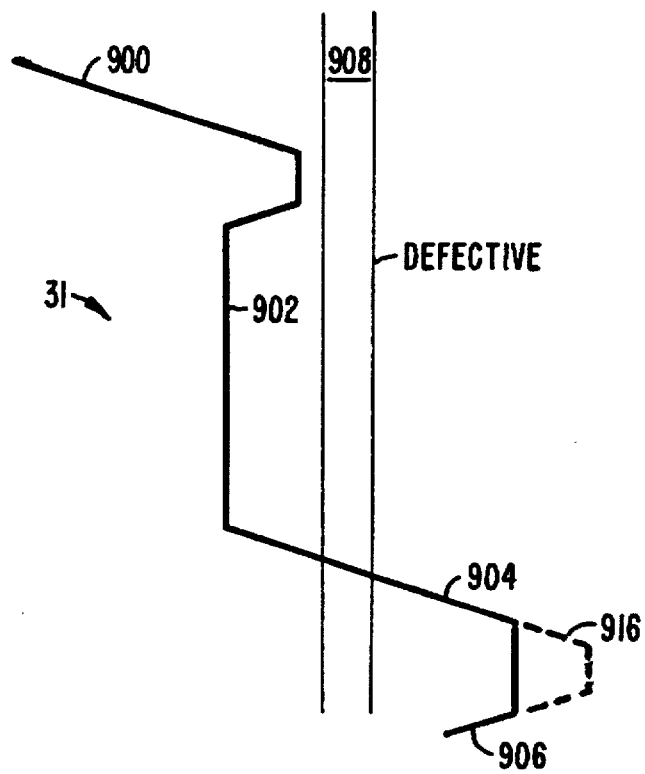
FIG. 9C illustrates a situation where a defective column is to the right of the vertical section of a vertical chevron.

FIG. 9C illustrates a situation where a defective column 908 is to the right of vertical section 902. For this case, connections must move to the right along bottom horizontal section 904 and return horizontal section 906. Connections to the right of defective column 908 cannot move to a different vertical chevron because this would require that connections on vertical section 902 also move to the right by one column even though these connections are to the left of defective column 908 and thus should remain in their original column. This requirement does not apply to the local chevrons 30 because their vertical sections do not have connections to other segments.

A u-shaped extension 916 to lower horizontal section 904 and horizontal return section 906 is provided. This allows connections in the rightmost column of the vertical chevrons 31 to shift to the right if necessary.

Another problem arises when a logic cell within a CST row 15 is split as a result of a defective column being removed from the connection pattern. Connectivity among transistors belonging to the same logic cell must be preserved including source/drain connections, since the transistors themselves may be dysfunctional causing the column to be considered defective. Furthermore, the modified connection pattern should not rely on transistors in the defective column for interconnection. Transistors in the defective column should be removed entirely from the cell.

Figure 10:
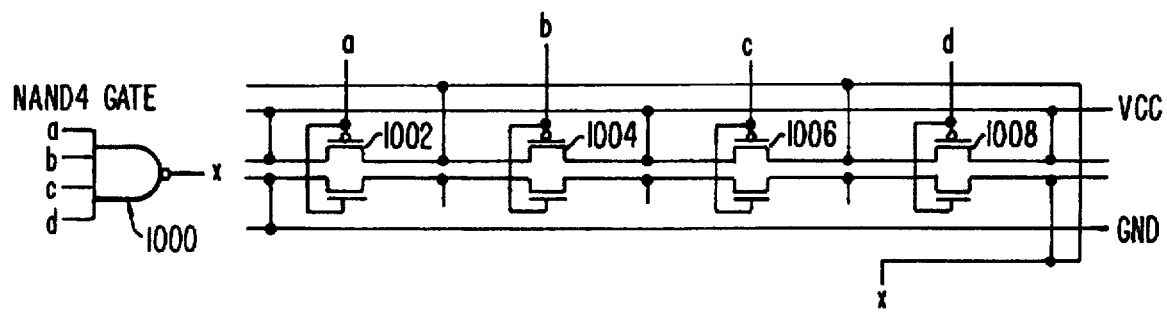
FIG. 10 depicts the use of CST resources to implement a logic cell in accordance with the invention.

FIG. 10 depicts the connections necessary to implement a 4-input NAND gate 1000 using four CST transistor pairs 1002, 1004, 1006, and 1008. As can be seen, all of the transistors of the N-channel side are connected to $V_{cc}$. It is typical for most such logic cell configurations that the transistors of either the N-channel side or the P-channel side are tied to either $V_{cc}$ or ground.

FIG. 11A illustrates how the connections of FIG. 10 are adjusted to correct for a defective column 1100, in accordance with the invention. In particular, the source drains of the n-channel side must be connected between transistor pairs 1004 and 1006 across the defective column. In accordance with the invention, this is accomplished using SD wiring segments 1102 and 1104, local chevrons 1106, 1108, and 1110 and special extensions 1112 and 1114. Special extensions 1112 and 1114 are not used for the original wiring pattern.

FIG. 11B shows a more precise representation of this connection in accordance with the invention in the context of the wiring diagram shown in FIG. 3. FIG. 11B further depicts the extensions described in reference to FIGS. 8 and 9.

The column redundancy technique described above allows FPGAs with only one or two defects to be used instead of discarded. The shifting of columns follows a regular pattern and generally affects columns in the vicinity of the defective column and the nearest redundant column. If the defect is a failed antifuse, the segments that pass through the defective column may have extra segments connected to them. This affects timing somewhat due to the resulting capacitance increase. The specified timing parameters of FPGAs with defective columns may therefore have to be adjusted to take this into account.

Channel Segment Redundancy

In accordance with the invention, redundant horizontal tracks are provided within an FPGA routing channel to substitute for tracks rendered unusable by defective antifuses.

Figure 12:
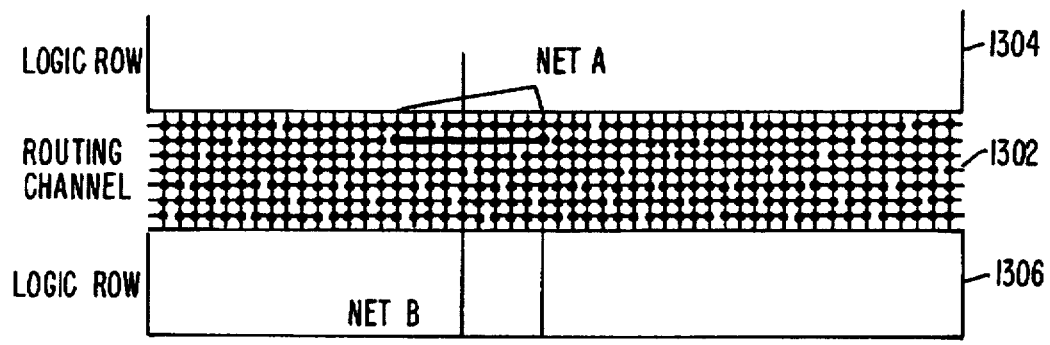
FIG. 12 depicts a simplified representation of a routing channel between two logic rows of an FPGA array.

FIG. 12 depicts a simplified representation of a routing channel 1302 between two logic rows 1304 and 1306 of an FPGA array. In the FPGA architecture described above, the logic row includes CST and LLB resources including associated chevrons and antifuses. The routing channel 1302 as depicted is composed of vertical wires spanning the entire height of the routing channel and segments of horizontal wires distributed in a random pattern across the width of the routing channel 1302. For simplicity, no chevrons are depicted. At the intersection of every vertical and horizontal wire is an antifuse.

An exemplary use of the routing channel for two different nets of a routed customer design will now be described in reference to FIG. 12. Net A uses one horizontal routing segment to connect two vertical wires, of which one spans the lower logic row 1306 and one spans only the routing channel 1302. Net B uses just one vertical wire spanning both logic rows 1304 and 1306 and does not use the routing channel 1302 at all.

Figure 13:
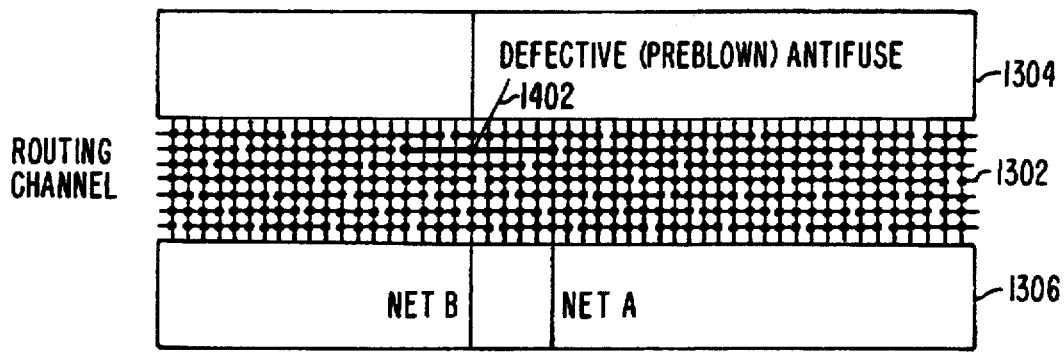
FIG. 13 depicts the routing channel of FIG. 11 with a defective antifuse, i.e. an antifuse that ruptured during stress testing.

FIG. 13 depicts the routing channel of FIG. 12 with a defective antifuse 1402, i.e. an antifuse that ruptured during stress testing. If Net A is routed and programmed the same as in FIG. 12, then the result is Net A shorts to Net B. As a result the design would fail to operate properly after programming.

Figure 14:
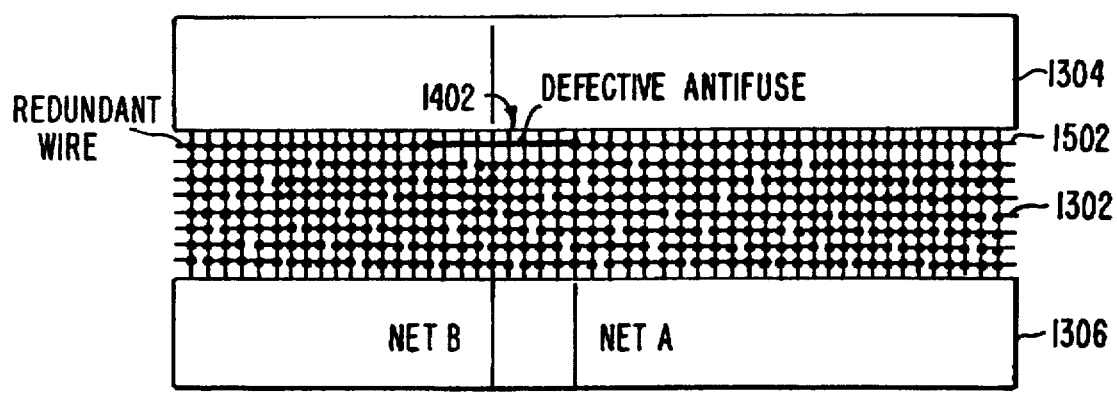
FIG. 14 depicts the routing channel of FIG. 11 modified in accordance with the invention to include an extra horizontal wire occupying an extra horizontal track.

FIG. 14 depicts the routing channel of FIG. 12 modified in accordance with the invention to include an extra horizontal wire 1502 occupying an extra horizontal track. The horizontal wire 1502 is called a redundant wire and is used only for rerouting nets containing horizontal wires with defective antifuses. The original routing of Net A shown in FIG. 11 has been rerouted to use the redundant horizontal wire. With the rerouting, Nets A and B are not shorted and the correct operation of the FPGA results after programming.

Because the redundant wire in FIG. 14 spans the entire routing channel, it can substitute for any horizontal segment in the routing channel. A redundant wire in one routing channel cannot however substitute for a horizontal segment in another routing channel because available vertical segments extending through CST and LLB rows do not necessarily reach other routing channels. Consequently, for complete coverage, every routing channel requires at least one redundant track.

A problem with rerouting a net from a short horizontal segment to a long redundant wire is the added capacitance of the long redundant wire. Because some segments in the channel are very short, the capacitance after mapping could be 60 times larger. This capacitance increase could cause unacceptable dynamic timing problems and/or slower chip operation.

Figure 15:
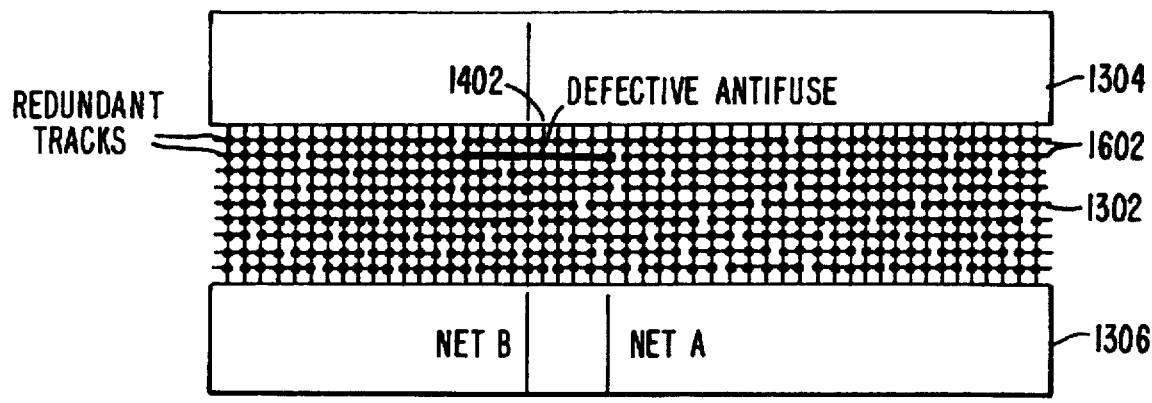
FIG. 15 depicts, in accordance with the invention, a variation of the row redundancy technique shown in FIG. 13.

FIG. 15 depicts, in accordance with the invention, a variation of the channel segment redundancy technique shown in FIG. 14. Instead of one redundant wire per channel, multiple redundant segments 1602 are reserved in two or more redundant tracks. This permits redundant segments to have shorter lengths and less capacitance. In FIG. 15, Net A is rerouted with a redundant segment that is only twice as long as the defective segment. In accordance with the invention, the redundant segments 1602 are arranged to maximize coverage of all non-redundant routing segments while maintaining the capacitance of redundant segments to be 2 to 4 times the capacitance of non-redundant segments. The FPGA architect must trade between capacitance penalty and area penalty caused by additional redundant tracks.

Figure 16:
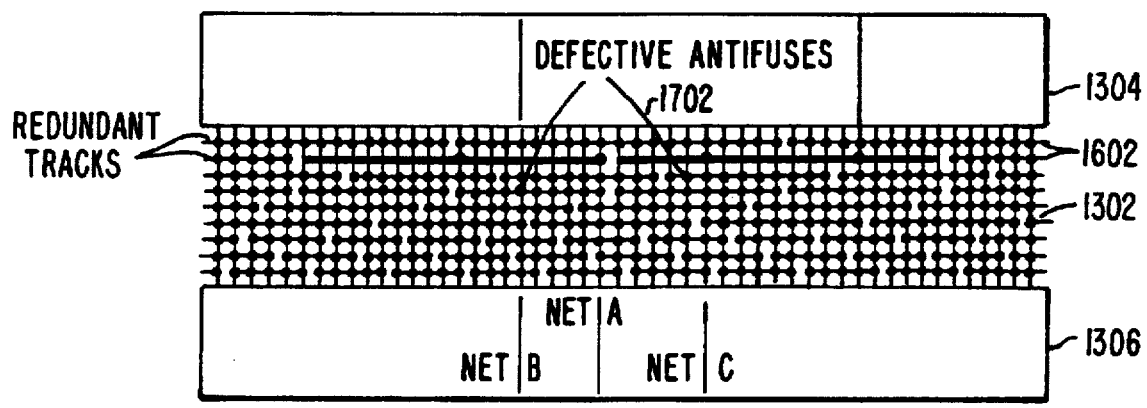
FIG. 16 illustrates how two nets are rerouted in accordance with the invention to prevent shorts to other nets because of defective antifuses on their preferred routing segments.

The use of shorter redundant segments also permits the repair of multiple defects per routing channel. FIG. 16 illustrates how both Net A and Net C have been rerouted to prevent shorts to other nets because of defective antifuses 1702 on their preferred routing segments.

The channel segment redundancy technique of the invention can also repair channels with pairs of horizontal segments shorted together. These types of shorts, although less frequent than defective antifuses, result from metal bridges between two adjacent parallel wires. Repair in this case is handled by rerouting the net using the shorter of the shorted pair to a redundant segment, thereby increasing the capacitance increase on both nets.

Channel segment redundancy can repair opens in horizontal segments but cannot repair shorts between adjacent vertical wires or defective logic row resources. These types of defects can be handled only via column redundancy. One advantage however of channel segment redundancy is that the added area cost for a few redundant tracks is very low, amounting to maybe 2% of a die area.

Programming Implementation

In the preferred embodiment, production testing equipment determines the defective antifuses ruptured during wafer stress testing and other defects. Referring again to FIG. 1, the encoded addresses of defective elements are stored in register 14A at the periphery of the FPGA 10. The register is itself a set of programmable antifuses located in the I/O circuitry 14.

The FPGA customer creates a routed design for the FPGA that assumes no defects and does not make use of redundant resources. The programming software adjusts for defects at the time of programming by reading the defect information from the registers and rerouting in accordance with the redundancy techniques described above. Since the redundancy techniques of the invention minimize changes to the original routed design there is very little impact on the run time of the programming software.

Thus, FPGAs with limited numbers of defects can be programmed using the above-identified techniques. The ability to use FPGAs which previously would have been deemed defective and discarded raises manufacturing yields, reducing costs.

Programming of Partially Defective FPGAs

The redundancy techniques described above can be extended by sorting defective FPGAs by application. Some FPGAs have too many defects to be universally programmable even using redundancy techniques. However, many of these defective FPGAs may nonetheless be programmable for a limited range of desired functions. In accordance with the invention, another technique for correcting the effects of FPGA defects is to sort defective FPGAs by application. This results in another effective increase in yield since FPGAs that would have been previously discarded are assigned to applications for which their excess defects are irrelevant.

Figure 17:
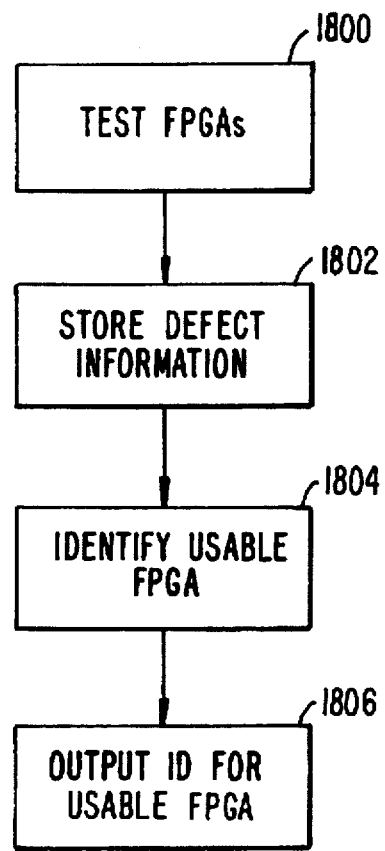
FIG. 17 is a flowchart describing steps of a method for identifying defective FPGAs suitable for a particular application in accordance with the invention.

FIG. 17 is a flowchart describing steps of a method for identifying defective FPGAs suitable for a particular application in accordance with the invention. At step 1800, a number of unprogrammed FPGAs are tested to identify their defects. Defects could include programmed antifuses, shorted line segments, open line segments etc. At step 1802, the defect information is then stored individually for each FPGA along with a unique identifier for the FPGA, e.g., in a database file on a disk drive.

An operator who wants to identify FPGAs capable of being programmed to perform a desired function, inputs information characterizing the desired function into a computer having access to the stored database file. This information could be, for example, a pattern of antifuses to program to configure an FPGA to perform the desired function.

At step 1804, the computer uses the stored defect information to identify an FPGA that can be programmed to perform the desired function, despite their particular defects. A particular defective FPGA may be able to perform the desired function either because all of its defects do not affect resources that would be normally used to perform the desired function, or because row or column redundancy techniques could be used to route around otherwise relevant defects. If more than one FPGA is deemed capable of being programmed to perform the desired function, the computer may select an FPGA deemed 'most defective' in accordance with some predetermined index of defectiveness. At step 1806, the computer outputs an identifier identifying the selected FPGA.

Figure 18:
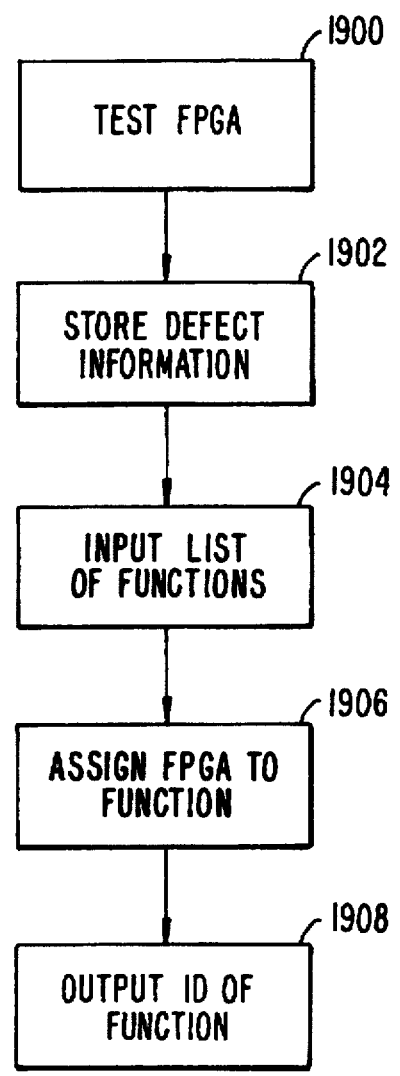
FIG. 18 is a flowchart describing steps of a method of sorting defective FPGAs among applications.

FIG. 18 is a flowchart describing steps of a method of sorting defective FPGAs among applications. At step 1900, an unprogrammed FPGA is tested to identify its defects. At step 1902, this defect information is electronically stored. At step 1904, a computer with access to the defect information accepts input identifying a plurality of desired functions for a programmed FPGA. Alternatively, this information may be prestored. At step 1906, the computer assigns the FPGA to a selected one of the desired functions that it can perform despite its defects. Again, an otherwise defective FPGA may be able to perform a desired function either because all of its defects are irrelevant for the desired function or avoidable using row and column redundancy. At step 1908, the computer outputs information identifying the selected desired function.

Conclusion

While the above is a complete description of the preferred embodiments of the invention, various alternatives, modifications and equivalents may be used. It should be evident that the present invention is equally applicable by making appropriate modifications to the embodiments described above. For example, column redundancy could be implemented with a different scheme for shifting connections horizontally toward a redundant column. The extension structure would then have to be modified accordingly. Therefore, the above description should not be taken as limiting the scope of the invention which is defined by the metes and bounds of the appended claims.

What is claimed is:

1. In an integrated circuit having an array of functional units and conducting line segments, each functional unit including a plurality of ports, said conducting line segments including line segments connected to said ports of said functional units and unconnected line segments, said line segments crossing each other in a predetermined pattern at intersections, said intersections having programmable devices connected to said crossing line segments programmable to connect said crossing line segments, said array being divided into a plurality of columns of individual functional units and surrounding programmable devices, wherein one or more of said columns are preselected to be redundant, a method of programming said integrated circuit to perform a desired function by programming selected ones of said programmable devices, said method comprising the steps of:

- testing said integrated circuit to obtain column defect information identifying a defective column;
- generating a first interconnection pattern of programmable devices to be programmed for said integrated circuit to perform said desired function, none of said programmable devices being included in said redundant columns;
- modifying said first interconnection pattern by displacing programmable devices to be programmed in said defective column by one column toward a redundant column and displacing columns between said defective column and said redundant column by one column toward said redundant column, thereby obtaining a second interconnection pattern of programmable devices to program for said integrated circuit to perform said desired function; and
- programming the programmable devices in said second interconnection pattern.

2. The method of claim 1 wherein said functional units are MOS transistors.

3. The method of claim 1 wherein said programmable devices are antifuses.

4. The method of claim 1 wherein one or more of said conducting line segments include extensions, said extensions being connected to programmable devices that are unavailable for said first interconnection pattern.

* * * * *